(12) United States Patent
Chen et al.

(10) Patent No.: US 9,537,048 B2
(45) Date of Patent: Jan. 3, 2017

(54) VERTICAL TYPE AC-LED DEVICE AND MANUFACTURING METHOD THEREOF

(71) Applicant: Xiamen Sanan Optoelectronics Technology Co., Ltd., Xiamen (CN)

(72) Inventors: Shunping Chen, Xiamen (CN); Xiaoqiang Zeng, Xiamen (CN); Shaohua Huang, Xiamen (CN); Qunfeng Pan, Xiamen (CN); Jyh-Chiarng Wu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/402,175

(22) PCT Filed: Mar. 21, 2013

(86) PCT No.: PCT/CN2013/072981
§ 371 (c)(1),
(2) Date: Nov. 19, 2014

(87) PCT Pub. No.: WO2013/174175
PCT Pub. Date: Nov. 28, 2013

(65) Prior Publication Data
US 2015/0144974 A1 May 28, 2015

(30) Foreign Application Priority Data
May 21, 2012 (CN) .......................... 2012 1 0157568

(51) Int. Cl.
*H01L 33/08* (2010.01)
*H01L 27/15* (2006.01)
(Continued)

(52) U.S. Cl.
CPC ............... *H01L 33/08* (2013.01); *H01L 27/15* (2013.01); *H01L 25/0753* (2013.01);
(Continued)

(58) Field of Classification Search
CPC ...... H01L 33/08; H01L 33/382; H01L 33/387; H01L 27/15; H01L 2933/0066
See application file for complete search history.

(56) References Cited

U.S. PATENT DOCUMENTS

2010/0109028 A1    5/2010    Chen et al.
2013/0126914 A1*   5/2013    Pan ....................... H01L 27/156
                                                            257/88

FOREIGN PATENT DOCUMENTS

CN    101950784 A    1/2011
CN    102683534 A    9/2012

OTHER PUBLICATIONS

International Preliminary Report on Patentability for International Application No. PCT/CN2013/072981, "Vertical Type AC-LED Device and Manufacturing Method Thereof", dated of issuance: Nov. 25, 2014.

(Continued)

*Primary Examiner* — Thanhha Pham
(74) *Attorney, Agent, or Firm* — Syncoda LLC; Feng Ma; Junjie Feng

(57) ABSTRACT

The present invention discloses a vertical AC LED element and fabrication method thereof, wherein the vertical AC LED element comprises a conductive substrate (102); a light-emitting module on the conductive substrate (102), including two horizontally arranged in parallel and mutually-isolated LEDs; wherein the first and second LEDs include a first semiconductor layer (111), a light-emitting layer (112) and a second semiconductor layer (113) from top down; a first insulating layer (131) is arranged between the second semiconductor layer (113) of the first LED and the
(Continued)

conductive substrate (102) for mutual isolation; an ohmic contact is formed between the second semiconductor layer (113) of the second LED and the conductive substrate (102); a first conductive structure that connects the first semiconductor layer (111) of the first LED, the second semiconductor layer (113) of the second LED and the conductive substrate (102); and a second conductive structure that connects the second semiconductor layer (113) of the first LED and the first semiconductor layer (111) of the second LED.

10 Claims, 12 Drawing Sheets

(51) Int. Cl.
*H01L 25/075* (2006.01)
*H01L 33/00* (2010.01)
*H01L 33/38* (2010.01)
*H01L 33/44* (2010.01)
*H01L 33/62* (2010.01)

(52) U.S. Cl.
CPC ........ *H01L 33/0079* (2013.01); *H01L 33/382* (2013.01); *H01L 33/44* (2013.01); *H01L 33/62* (2013.01); *H01L 2924/0002* (2013.01); *H01L 2933/0066* (2013.01)

(56) References Cited

OTHER PUBLICATIONS

International Search Report, PCT/CN2013/072981, "Vertical Type AC-LED Device and Manufacturing Method Thereof," date of mailing Jun. 27, 2013.

* cited by examiner

VERTICAL TYPE AC-LED DEVICE AND MANUFACTURING METHOD THEREOF

RELATED APPLICATIONS

This application is the U.S. National Stage of International Application No. PCT/CN2013/072981, filed on Mar. 21, 2013, published in Chinese, which claims priority to Chinese Patent Application No. 201210157568.5 filed on May 21, 2012. The entire teachings of the above applications are incorporated herein by reference.

FIELD OF THE INVENTION

The present invention relates to a semiconductor light-emitting element and fabrication method thereof, more particularly, to a vertical alternating current light emitting diode (AC-LED).

BACKGROUND OF THE INVENTION

The LED of the solid light-emitting element, owing to such electrical and optical advantages as low energy consumption, long service life, good stability, small size, fast response and stable light-emitting wave length, is widely applied in fields like illumination, household appliance, display and indicator. Moreover, this kind of light-emitting element enjoys considerable progress in light-emitting effect and service life and therefore, is promising to become the mainstream for a new generation of lighting and light-emitting element.

For traditional LED, a transformer is required during power supply to LED since it is driven by direct current (DC) while the general power supply is alternating current (AC), which not only increases the usage cost but also impedes the application of LED that is not originally intended for energy saving, due to electric energy loss during DC-AC transformation. In contrast, the AC LED, through DC-AC transformation, is available for usage as long as the general electric supply voltage is reduced. Without a transformer, the AC LED is more competitive than the traditional illuminants for it saves cost and space.

In general, the AC-LED often retains the original growth substrate and forms a vertical AC-LED by going through a complex process either by a) horizontally leading an interconnected lateral AC LED or b) by die pasting and flip-chip bonding after a single chip is completed.

SUMMARY OF THE INVENTION

The present invention discloses a vertical AC LED element with a lateral die and fabrication method thereof. This structure is of good heat dissipation and high overload performance like a vertical chip structure, and at the same time, saves transformation element cost like an AC LED structure does.

According to a first aspect of this invention, a vertical AC LED element comprises a conductive substrate; a light-emitting module on the conductive substrate, including two horizontally arranged in parallel and mutually-isolated LEDs, wherein the first and second LEDs include a first semiconductor layer, a light-emitting layer and a second semiconductor layer from top down; a first insulating layer is arranged between the second semiconductor layer of the first LED and the conductive substrate for mutual isolation; an ohmic contact is formed between the second semiconductor layer of the second LED and the conductive substrate; a first conductive structure that connects the first semiconductor layer of the first LED, the second semiconductor layer of the second LED and the conductive substrate; and a second conductive structure that connects the second semiconductor layer of the first LED and the first semiconductor layer of the second LED.

In a first preferred embodiment of this invention, an ohmic contact layer is further arranged between the conductive substrate and the light-emitting module; the light-emitting module connects to the conductive substrate via a metal bonding layer; the first insulating layer is between the metal bonding layer and the ohmic contact layer on the second semiconductor layer of the first LED; a channel is arranged in the first LED that goes through the second semiconductor layer and the light-emitting layer, the bottom of which is on the first semiconductor layer, and the side wall of which is covered with an insulating layer; the metal bonding layer completely covers the second semiconductor layer of the light-emitting module and fills the channel to constitute the first conductive structure; a channel is formed between the first LED and the second LED, the side wall of which is covered with a second insulating layer, the middle of which is filled with conductive material to form a conductive column, the two ends of which are connected to the second semiconductor layer of the first LED and the first semiconductor layer of the second LED, respectively, thus constituting the second conductive structure; and one and only one electrode structure is on the light emitting surface of the light-emitting module that connects with the second conductive structure.

In a second preferred embodiment of this invention, the difference from the first embodiment is that the first insulating layer is on the conductive substrate and bonds with the light-emitting module via the metal bonding layer.

According to a second aspect of this invention, a vertical AC LED fabrication method, including the following steps:

1) providing a growth substrate, on which a light-emitting epitaxial layer is formed via epitaxial growth, which comprises a first semiconductor layer, a light-emitting layer and a second semiconductor layer from bottom top;

2) defining the size of a single light-emitting module and dividing the light-emitting epitaxial layer into a plurality of light-emitting modules, each comprising a forward conductive region, a backward conductive region and an isolating region between the two;

3) fabricating a first conductive structure and providing a conductive substrate to connect the light-emitting epitaxial layer to the conductive substrate; wherein, a first insulating layer is formed between the second semiconductor layer in the backward conductive region and the conductive substrate for mutual isolation; and an ohmic contact is formed between the second semiconductor layer in the forward conductive region and the conductive substrate; the first conductive structure connects the first semiconductor layer in the backward conductive region, the second semiconductor layer in the forward conductive region and the conductive substrate;

4) removing the growth substrate;

5) isolating the light-emitting epitaxial layers of the forward conductive region and the backward conductive region to form a first LED and a second LED, wherein the first LED corresponds to the backward conductive region and the second LED corresponds to the forward conductive region;

6) fabricating a second conductive structure that connects the second semiconductor layer of the first LED and the first semiconductor layer of the second LED.

In this invention, the fabrication method may further include the following steps: forming a patterned ohmic contact layer on the second semiconductor layer of the light-emitting epitaxial layer, which covers the forward conductive region, the backward conductive region and a part of the isolating region approaching to the backward conductive region of each of the light-emitting modules.

Preferably, step 3 can be realized through the following methods. Define a conductive region in the backward conductive region and etch the second semiconductor layer of the light-emitting epitaxial layer in the conductive region and the light-emitting layer to expose the first semiconductor layer; form a patterned ohmic contact layer on the second semiconductor layer of the light-emitting epitaxial layer that covers the forward conductive region, the backward conductive region and a part of the isolating region approaching to the backward conductive region of each of the light-emitting modules; form a first patterned insulating layer on the ohmic contact layer that covers the upper surface of the ohmic contact layer of the backward conductive region, the side wall of the conductive region and the junction of the forward and backward conductive regions; form a metal bonding layer on the surface of the light-emitting epitaxial layer processed through the above steps that covers the surface of the entire light-emitting epitaxial layer; and form a conductive column in the conductive region of the backward conductive layer to constitute a first conductive structure; and provide a conductive substrate to bond the light-emitting epitaxial layer with the conductive substrate through wafer bonding technology.

Preferably, the second conductive structure is formed through the following methods. Form a channel in the isolating region of the light-emitting epitaxial layer; cover a second insulating layer on the side wall of the channel and fill in with conductive material in the middle to form a conductive column, two ends of which are connected to the second semiconductor layer of the first LED and the first semiconductor layer of the second LED, respectively, to constitute the second conductive structure.

According to a third aspect of this invention, a vertical AC LED fabrication method includes the following steps:

1) providing a growth substrate, on which a light-emitting epitaxial layer is formed via epitaxial growth, which comprises a first semiconductor layer, a light-emitting layer and a second semiconductor layer from bottom top;

2) defining the size of a single light-emitting module and dividing the light-emitting epitaxial layer into a plurality of light-emitting modules, each comprising a forward conductive region, a backward conductive region and an isolating region between the two;

3) isolating the light-emitting epitaxial layers of the forward conductive region and the backward conductive region to form a first LED and a second LED, wherein the first LED corresponds to the backward conductive region and the second LED corresponds to the forward conductive region;

4) fabricating a first conductive structure and providing a conductive substrate to connect the light-emitting epitaxial layer to the conductive substrate; wherein, a first insulating layer is formed between the second semiconductor layer in the backward conductive region and the conductive substrate for mutual isolation; and an ohmic contact is formed between the second semiconductor layer in the forward conductive region and the conductive substrate; the first conductive structure connects the first semiconductor layer of the first LED, the second semiconductor layer of the second LED and the conductive substrate;

5) removing the growth substrate;

6) fabricating a second conductive structure that connects the second semiconductor layer of the first LED and the first semiconductor layer of the second LED.

In this invention, the fabrication method may further include the following steps: forming a patterned ohmic contact layer on the second semiconductor layer of the light-emitting epitaxial layer, which covers the forward conductive region, the backward conductive region and a part of the isolating region approaching to the backward conductive region of each of the light-emitting modules.

Preferably, step 4 is realized through the following methods. Define a conductive region in the backward conductive region and etch the second semiconductor layer of the light-emitting epitaxial layer in the conductive region and the light-emitting layer to expose the first semiconductor layer; form a patterned ohmic contact layer on the second semiconductor layer of the light-emitting epitaxial layer that covers the forward conductive region and backward conductive region of each of the light-emitting modules; form a conductive column in the conductive region, the side wall of which is covered with an insulating layer; provide a conductive substrate, the surface of which is divided into two regions, wherein the first region is an insulating region, the surface of which is an insulating material and the second region is a conductive region; cover a metal bonding layer on the conductive substrate, which entirely covers the conductive region and the central region of the insulating region; bond the light-emitting epitaxial layer processed through the above treatments with the conductive substrate; wherein, the backward conductive region is in the insulating region of the conductive substrate and an electrical insulation is realized between the second semiconductor layer and the conductive substrate, the forward conductive region is in the conductive region of the conductive substrate and an ohmic contact is realized between the second semiconductor layer and the conductive substrate; the conductive column connects to the metal bonding layer in the conductive region of the conductive substrate for the connection of the first semiconductor layer of the first LED, the second semiconductor layer of the second LED and the conductive substrate.

This invention has the following advantages: compared with the traditional lateral AC-LED, which forms the AC-LED either by a) electrical connection of fabricated die through leading or b) by electrical connection of DC-LED during encapsulation, the vertical AC LED disclosed by this invention can be realized in the die process with simple process. Moreover, the conductive substrate outperforms the insulating substrate like sapphire in terms of thermal conductivity, which is more suitable to high current drive. In addition, the light emitting surface of the vertical AC LED disclosed in this invention only requires an electrode bonding pad, thus overcoming the electrode shading problem, improving the light-emitting effect and reducing the raw material cost.

Other features and advantages of this invention will be described later in the Specification, and moreover, will become obvious partially through the Specification or understood through implementation of this invention. The objects and other advantages of this invention will be realized and achieved through the structure specifically described in the Specification, Claims and Drawings.

BRIEF DESCRIPTION OF THE DRAWINGS

The embodiments will be described with reference to the above description and the accompanying drawings. Those skilled in the art will have a more thorough understanding of the objects, features and advantages of this invention. For the purpose of a clear description, the drawings are not depicted to scale.

Legends in the drawings are.

101: growth substrate; 102: conductive substrate; 110: light-emitting epitaxial layer; 111: n-type semiconductor layer; 112: light-emitting layer; 113: p-type semiconductor; 120: high reflectivity ohmic contact layer; 131: first insulating layer; 132: second insulating layer; 140: metal bonding layer; 141: shared electrode layer; 150: back electrode; 160: conductive hole; 170: channel; 201: growth substrate; 202: conductive substrate; 210: light-emitting epitaxial layer; 211: n-type semiconductor layer; 212: light-emitting layer; 213: p-type semiconductor; 220: high reflectivity ohmic contact layer; 231, 232: insulating layer; 240: conductive column; 241, 242: metal bonding layer; 243: shared electrode layer; 250: back electrode; 260: conductive region of the first LED; 270: channel; A: backward conductive region; B: forward conductive region; C: isolating region.

SPECIFIC EMBODIMENTS

Now, the embodiments of the present invention will be described in detail by referring to the following figures to ensure that the application of technical means of the present invention to solve technical problems and the process for achieving the technical effects can be fully understood and implemented accordingly. It should be noted that as long as there is no conflict, all embodiments and all features in each embodiment of this invention may be combined and the resultant technical solutions are all encompassed by this invention.

Embodiment 1

Figure 1:
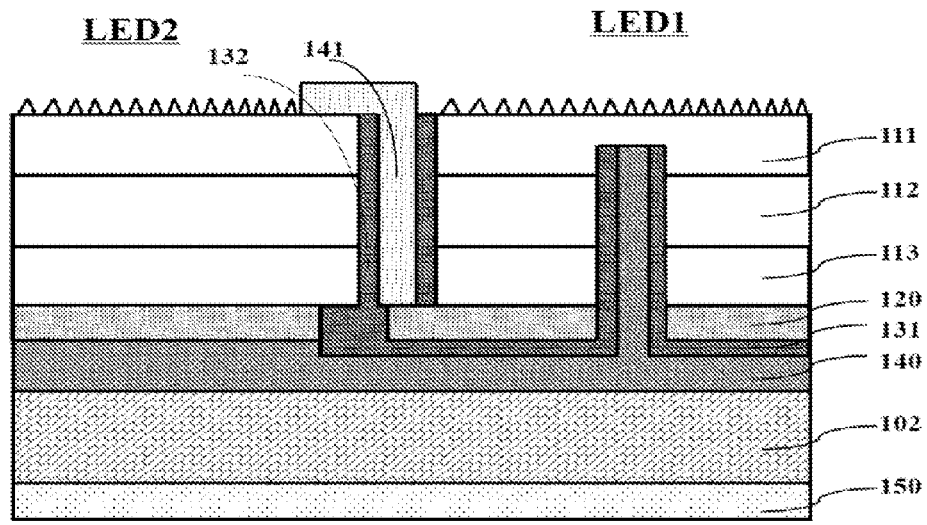
FIG. 1 is a structural section view of a vertical AC LED element of a first preferred embodiment of this invention.

Referring to FIG. 1, a vertical AC LED element comprises a conductive substrate 102, a light-emitting module, a high reflectivity ohmic contact layer 120, a metal bonding layer 140, a first conductive structure, a second conductive structure and a back electrode 150. The conductive substrate 102, in general, is a material of good heat dissipation. The light-emitting module, comprising an LED 1 and an LED 2, is bonded on the conductive substrate 102 through the metal bonding layer. The LED 1 and LED 2 comprise an n-type semiconductor layer 111, a light-emitting layer 112 and a p-type semiconductor layer 113 from top down, which are mutually isolated from each other, wherein the LED 1 is electrically insulated from the conductive substrate 102 via the insulating layer 131 and the high reflectivity ohmic contact layer 120 is covered on the lower surfaces of the p-type semiconductor layers of LED 1 and LED 2 as well as the part of the isolating region approaching to the LED 1. A channel is arranged in the LED 1 that goes through the p-type semiconductor 113 and the light-emitting layer 112, the bottom of which is on the n-type semiconductor layer 111, and the side wall of which is covered with an insulating layer, the metal bonding layer 140 completely covers the bottom surfaces of the p-type semiconductor layers of LED 1 and LED 2 and fills the channel to constitute the first conductive structure. A channel is formed between the LED 1 and the LED 2, the side wall of which is covered with a second insulating layer 132, the middle of which is filled with a conductive material, forming a shared electrode layer 141, and two ends of which are connected to the n-type semiconductor layer of LED 2 and the high reflectivity contact layer 120 under the LED 1, respectively, thus constituting a second conductive structure.

In this element structure, through the outer surface of the patterned light-emitting epitaxial layer, an insulating layer is formed at the side of the p-type layer of LED 1 away from the light-emitting layer to control the positions of the high reflectivity ohmic contact layer 120 and the insulating layer 131. A shared electrode layer 141 is formed in the isolating region between the LED 1 and the LED 2. The front shared electrode layer electrically connects the other two ends with only one electrode bonding pad in the middle of the two regions. After then, a vertical AC LED can be formed via wafer bonding technology.

Figure 3:
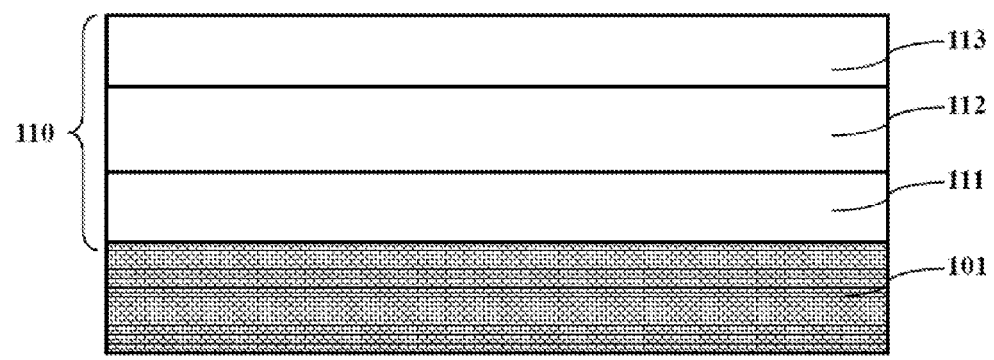
FIGS. 3-12 are schematic diagrams of the fabrication process for the vertical AC LED element as shown in FIG. 1.
Figure 4:
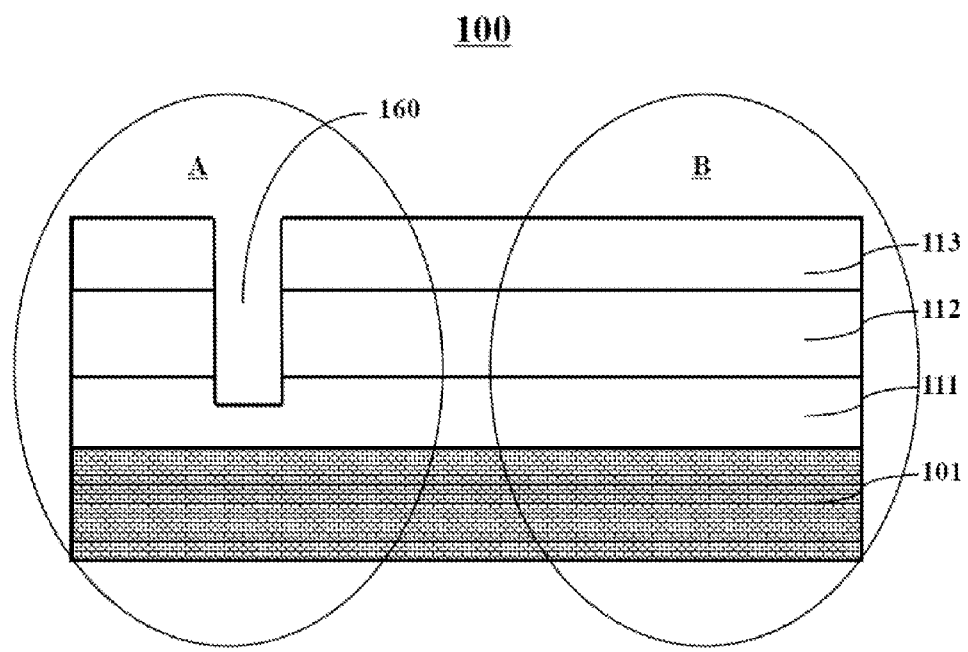

Now, detailed descriptions will be given to the above structure in combination with fabrication method. A fabrication method of the vertical AC LED element comprises the following steps:

Referring to FIG. 3, grow an n-type semiconductor layer 111, a light-emitting layer 112 and a p-type semiconductor layer 113 successively on a growth substrate 101 (e.g. sapphire) via MOCVD to form a light-emitting epitaxial layer 110.

Next, define the size of a single light-emitting module and divide the light-emitting epitaxial layer into a plurality of light-emitting modules, each comprising a forward conductive region A, a backward conductive region B and an isolating region C between the two. Define a conductive region in the backward conductive region A and etch this conductive region to the n-type semiconductor layer 110 via yellow light lithography, dry etching and other etching technologies to form at least one conductive hole 160 either in round or in rectangle (see FIG. 3 for the side sectional view).

Figure 5:
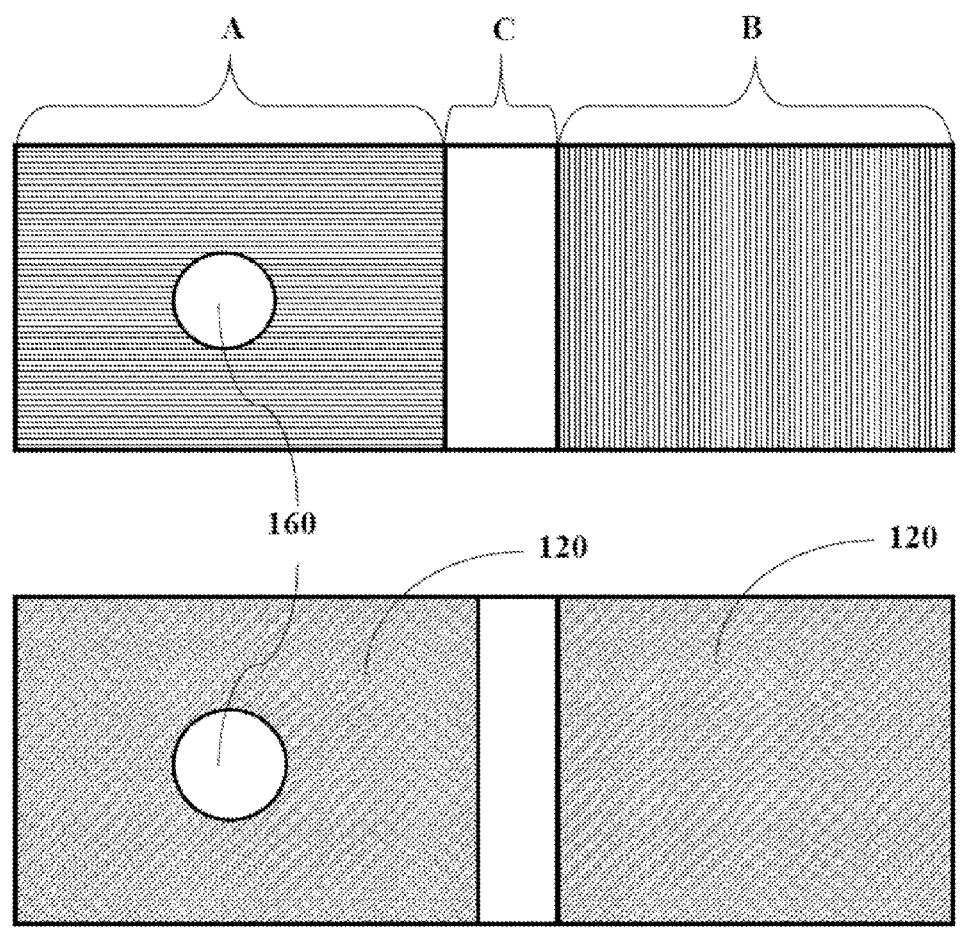
Figure 6:
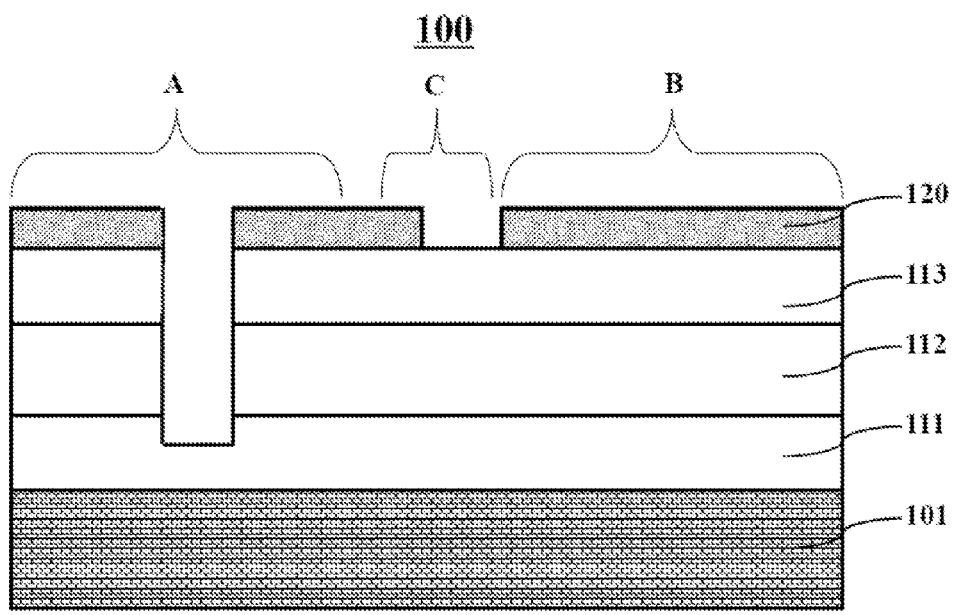

Next, referring to FIG. 6, form a high reflectivity p-type ohmic contact layer 120 on the light-emitting epitaxial layer through yellow light lithography, electron beam evaporation and other technologies, which is composed of a first metal contact layer (one or more of elements from Pt, Ni and Pd) having good contact with the p-type semiconductor and a metal reflecting layer (Ag or Al, or specially-fabricated Ag—Al alloy of high reflectivity). The first metal contact layer should absorb the light emitted by the active layer as little as possible; this layer can be directly composed of a metal material (e.g. Ag) of high reflectivity to visible light and having good contact with the p-type semiconductor layer. Referring to FIG. 5, the upper figure is a top view of the p-type ohmic contact layer 120 not yet formed with high reflectivity, wherein the forward conductive region A and the backward conductive region B are separated by the isolating region C; the lower figure is a top view of the p-type ohmic contact layer 120 already formed with high reflectivity, wherein the high reflectivity p-type ohmic contact layer 120 covers the forward conductive region B, the backward conductive region A and the part of the isolating region that approaches to the backward conductive region A.

Figure 7:
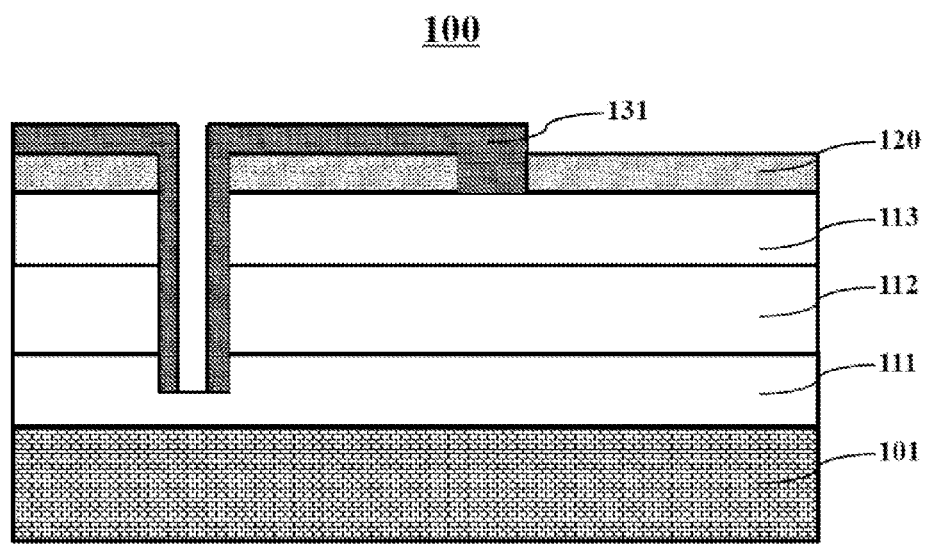

Next, form a first patterned insulating layer 131 on the high reflectivity p-type ohmic contact layer 120 through PECVD, yellow light lithography and chemical etching, which covers the upper surface of the high reflectivity p-type ohmic contact layer 120 at the backward conductive region side, the side wall of the conductive hole 160 and the upper surface of the p-type semiconductor layer that is not covered with the ohmic contact layer 120 in the junction of the forward and backward conductive regions (see FIG. 7 for the side sectional view). This insulating layer functions to a) electrically insulate the n-type semiconductor layer from the p-type semiconductor layer in the backward conductive region and to b) isolate the forward conductive region from the reflective p-type ohmic contact layer in the backward conductive region. This insulating material can be $SiO_2$, $SiN_x$, BCB, etc.

Next, form a metal bonding layer 140 on the surface of the light-emitting epitaxial layer processed through the above steps, which covers the whole surface including through hole of the backward conductive region, the first insulating layer and the p-type ohmic contact layer of the forward conductive region, and fills the conductive hole 160 in the backward conductive region to form a conductive column, and constitute the first conductive structure. This layer can be a plurality of combinations comprising Cr, Ti, Pt and Au.

Figure 8:
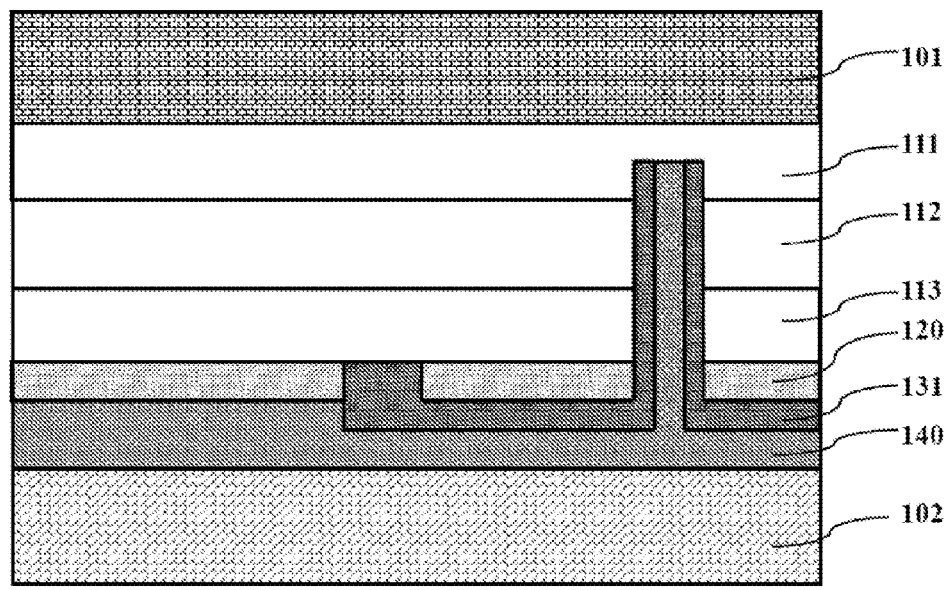

Next, provide a conductive substrate 102 and connect the light-emitting epitaxial layer with the conductive substrate via wafer bonding technology (see FIG. 8 for the side sectional view).

Figure 9:
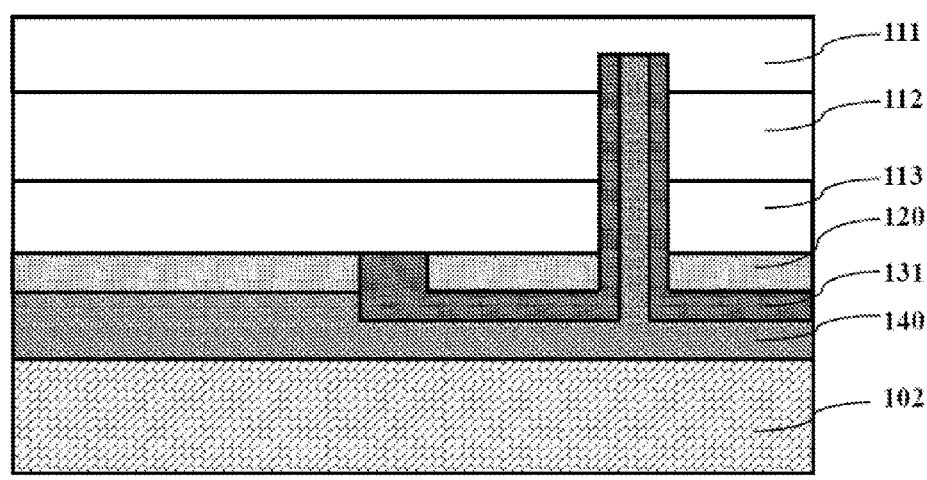

Next, remove the growth substrate 101 (see FIG. 9 for the side sectional view). In this embodiment, the growth substrate is sapphire and the growth substrate can be removed by LLO.

Figure 10:
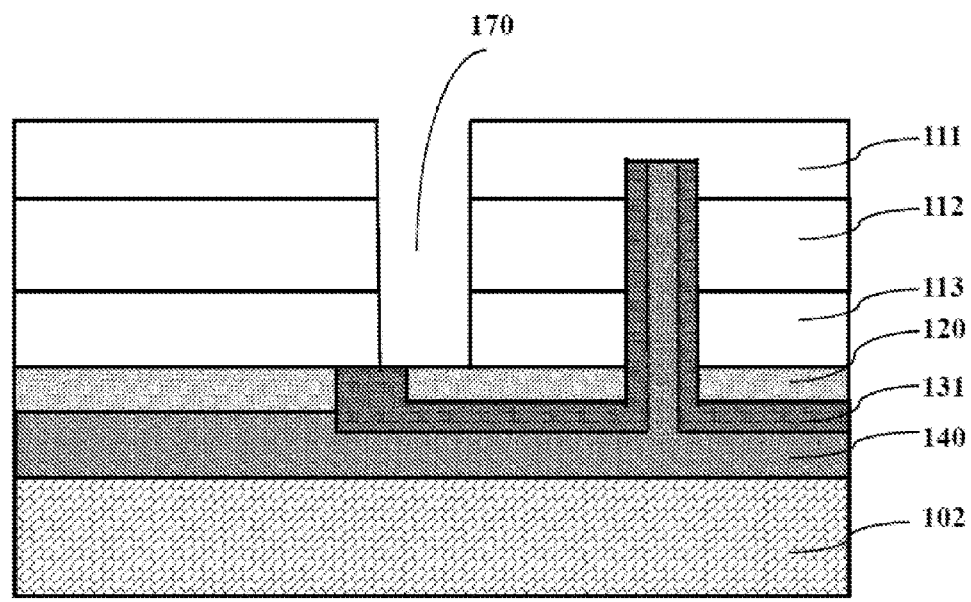

Next, form a channel 170 on the light-emitting epitaxial layer through yellow light lithography, dry etching or other processes to isolate the light-emitting epitaxial layers of the forward conductive region and the backward conductive region, thus forming the first LED 1 and the second LED 2, wherein the first LED corresponds to the backward conductive region and the second LED corresponds to the forward conductive region (see FIG. 10 for the side sectional view).

Figure 11:
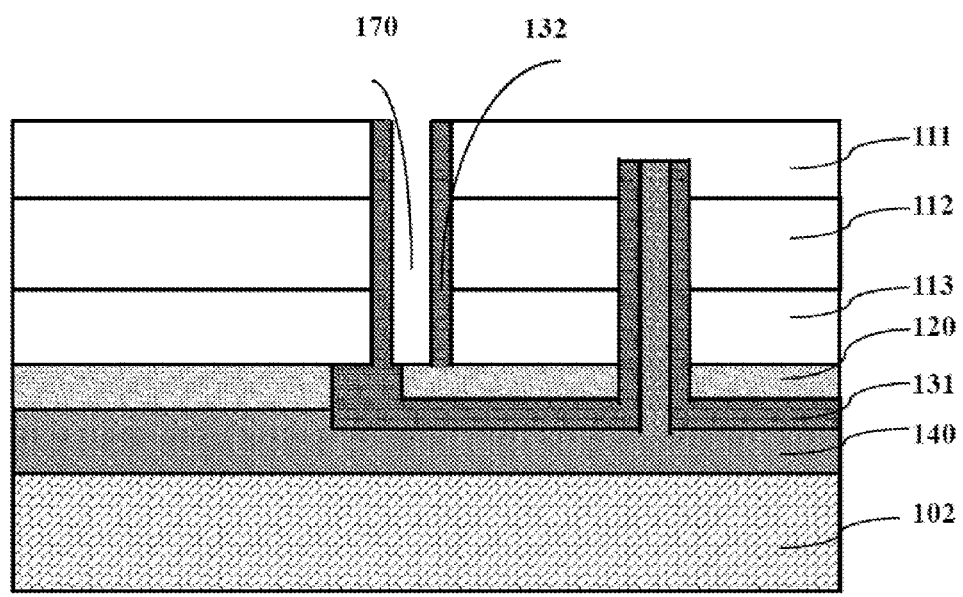

Next, form a second insulating layer 132 (see FIG. 11 for the side sectional view) on the side wall of the channel 170. The specific process is as follows: forming an insulating material via PECVD or spin coating and fabricating the second insulating layer 110 via the combination of yellow light lithography, dry etching and wet etching. This insulating layer should be composed of a transparent insulating material with relatively good gap filling performance, e.g., one or more combinations of SOG, $SiN_x$ and BCB.

Figure 12:
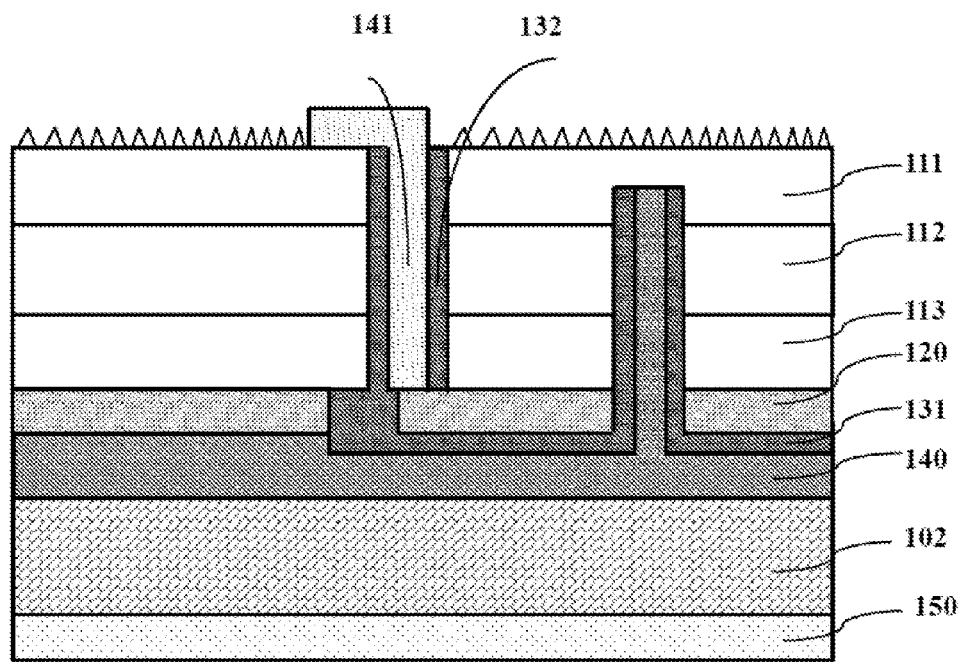

Next, fabricate the second conductive structure. Fabricate a shared electrode layer 111 on the channel 170 via vacuum electron beam, yellow light lithography and metal glass technology, two ends of which are connected to the p-type semiconductor layer of LED 1 and the n-type semiconductor layer of LED 2, respectively, to constitute the second conductive structure. This shared electrode layer should be able to form good electric contact with the n-type semiconductor layer and the reflective p-type ohmic contact layer. This layer can comprise a plurality of combinations from Cr, Ti, Pt and Au and the thickness is available for later encapsulation, welding and leading. Thinner the conductive substrate 102 via substrate thinning technology and evaporate the back electrode 150 to form a vertical AC LED. To achieve better light emitting effect, roughen the n-type semiconductor surface. See FIG. 12 for the side sectional view of the completed element.

In this fabrication method, a vertical AC LED element is formed simply by setting the patterned p-type ohmic contact layer 120 and the insulating layer 131, arranging a conductive through hole in the LED 1 and injecting the conductive metal into the through hole during wafer bonding.

Embodiment 2

Figure 2:
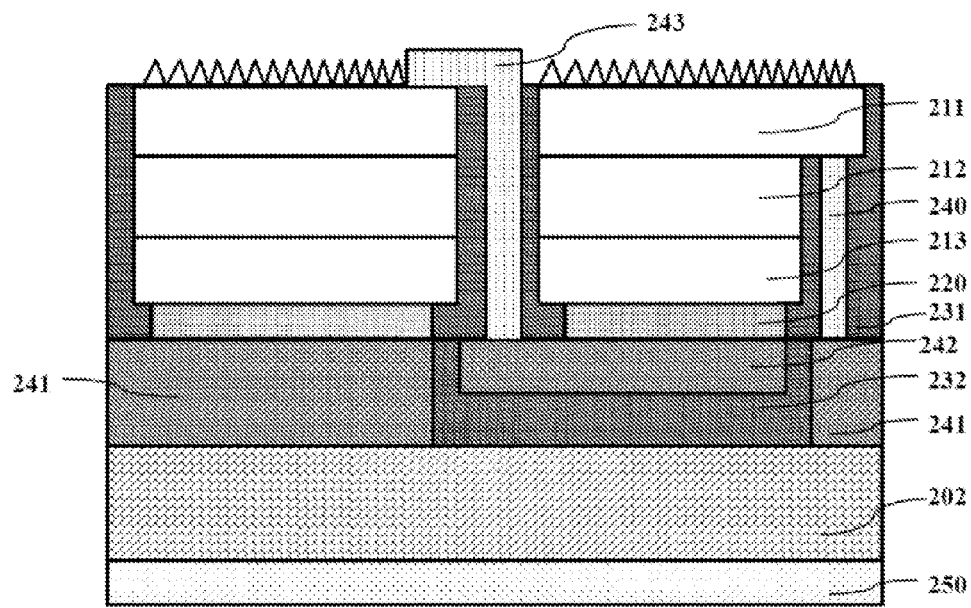
FIG. 2 is a structural section view of a vertical AC LED element of a second preferred embodiment of this invention.

Referring to FIG. 2, a vertical AC LED element comprises a conductive substrate 202, a light-emitting module, a high reflectivity ohmic contact layer 220, a metal bonding layer 240, insulating layers 231 and 232, a first conductive structure, a second conductive structure and a back electrode 250. The main difference between this embodiment and Embodiment 1 is the position of the insulating layer. In Embodiment 1, the insulating layer is between the metal bonding layer and the p-type semiconductor layer of LED 1. Through the patterned epitaxial layer, the insulating layer is formed on the p-type semiconductor layer of LED 1. However, in this embodiment, the insulating layer is between the metal bonding layer and the conductive substrate. The patterned conductive substrate divides the surface of the insulating layer into two regions, wherein the first region is an insulating region, the surface of which is an insulating material and the second region is a conductive region, the metal bonding layers 241 and 242 completely cover the conductive region and the central region of the insulating region, thus impeding the p-type semiconductor of LED 1 from connecting to the conductive substrate 202. The metal bonding layer 241 forms in the conductive region and the metal bonding layer 242 forms in the insulating region, and the two are not mutually connected. The conductive column 240 and the metal bonding layer 241 constitute the first conductive structure and connect the n-type semiconductor layer of LED 1, the conductive substrate 202 and the p-type semiconductor of LED 2; the shared electrode layer 243 and the metal bonding layer 242 constitute the second conductive structure and connect the p-type semiconductor layer of LED 1 and the n-type semiconductor layer of LED 2 to form a vertical AC LED.

Figure 13:
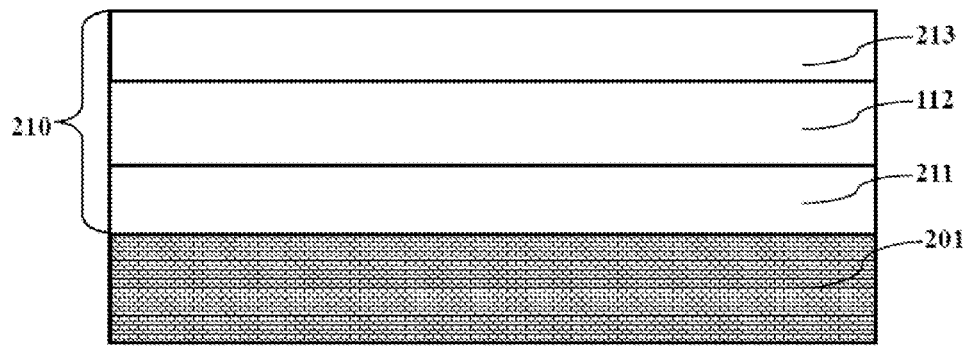
FIGS. 13-20 are schematic diagrams of the fabrication process for the vertical AC LED element as shown in FIG. 2.

Now, detailed descriptions will be given to the above structure in combination with fabrication method. A fabrication method of the vertical AC LED element comprises the following steps:

Firstly, referring to FIG. 13, grow an n-type semiconductor layer 211, a light-emitting layer 212 and a p-type semiconductor layer 213 successively on a growth substrate 101 (e.g. sapphire) via MOCVD to form a light-emitting epitaxial layer 210.

Figure 14:
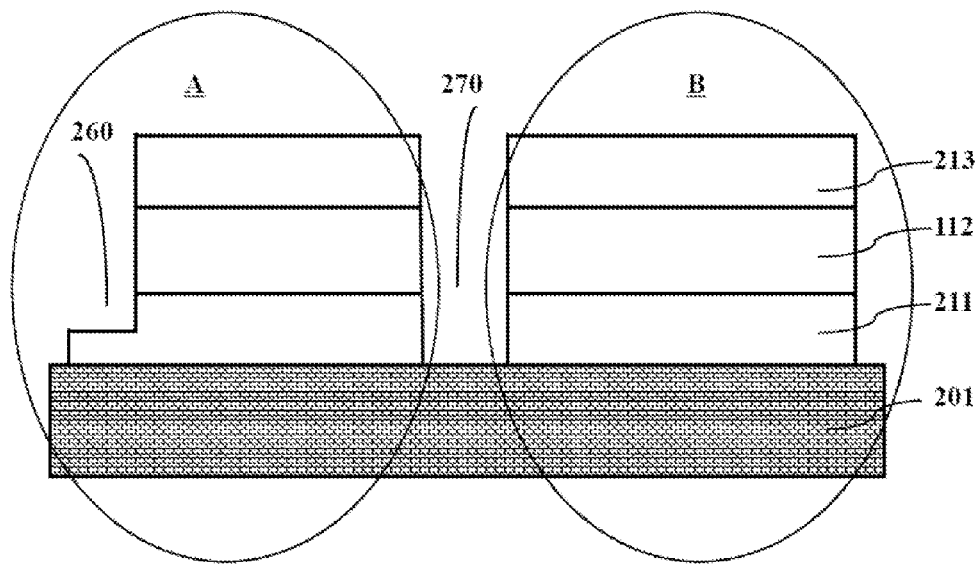

Next, define the size of a single light-emitting module and divide the light-emitting epitaxial layer into a plurality of light-emitting modules, each comprising a forward conductive region A, a backward conductive region B and an isolating region C between the two. Define a conductive region in the backward conductive region A and punch the light-emitting epitaxial layer in the isolating region C and the p-type semiconductor layer and the light-emitting layer in the conductive region via ICP dry etching. Referring to FIG. 14, expose an n-type semiconductor layer in the conductive region; expose the growth substrate in the isolating region C. The light-emitting epitaxial layer is divided into two LEDs, wherein the LED 1 corresponds to the backward conductive region and the LED 2 corresponds to the forward conductive region.

Figure 15:
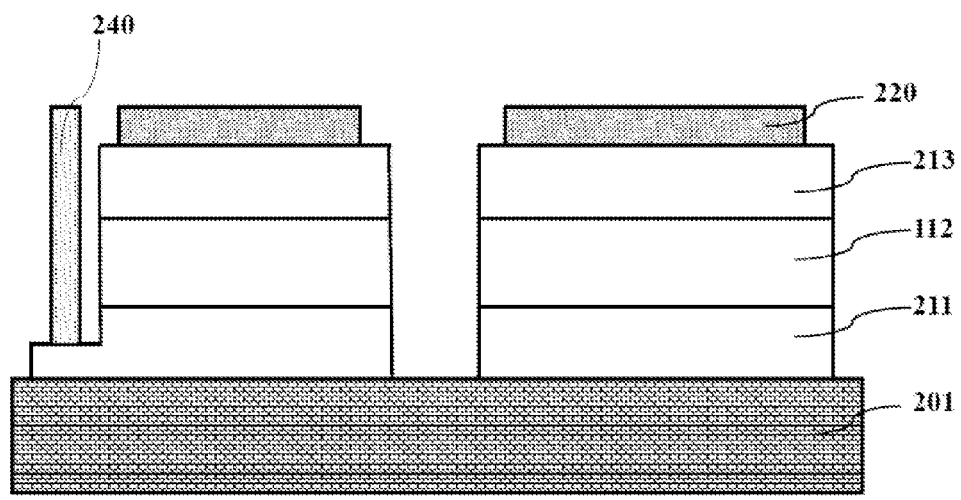

Next, form a high reflectivity p-type ohmic contact layer 220 on the p-type semiconductor layer by means of electron beam evaporation. Deposit through evaporation a conductive column 240 on the n-type semiconductor layer punched by ICP having the same thickness as the high reflectivity p-type ohmic conductor layer 220. See FIG. 15 for the side sectional view.

Figure 16:
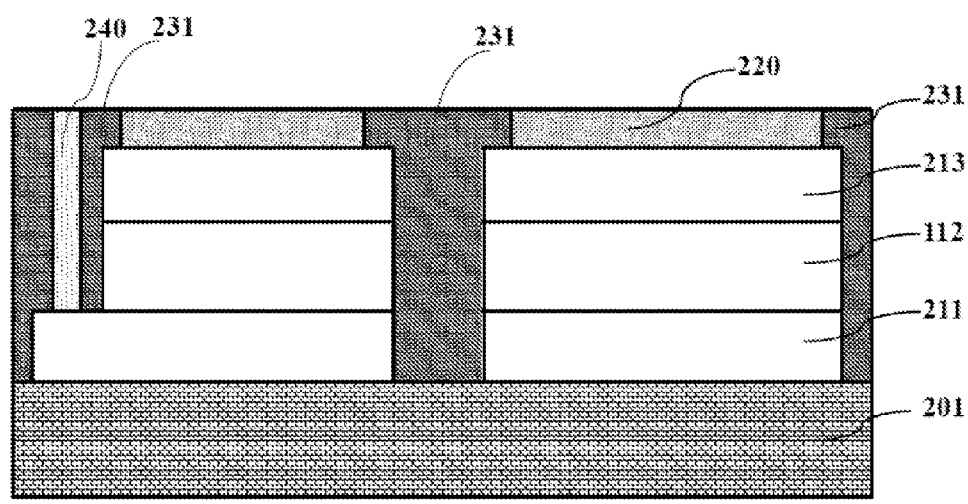

Next, referring to FIG. 16, fill the isolating region with the filling material 231 to a height parallel to the high reflectivity p-type ohmic contact layer 220.

Figure 17:
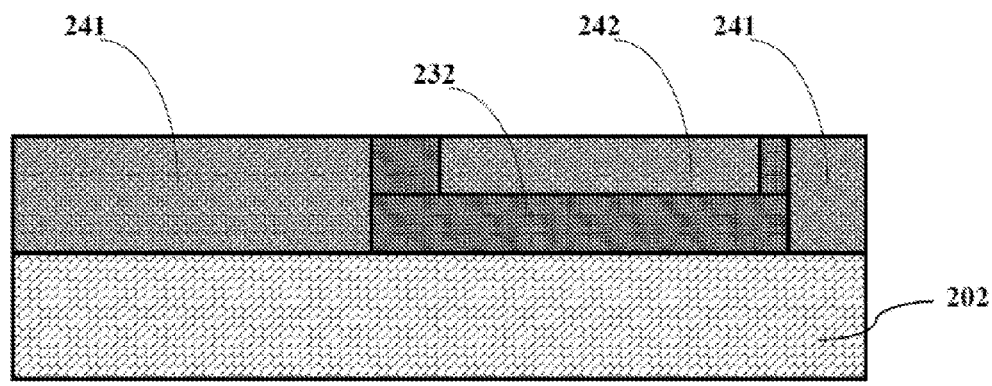
Figure 18:
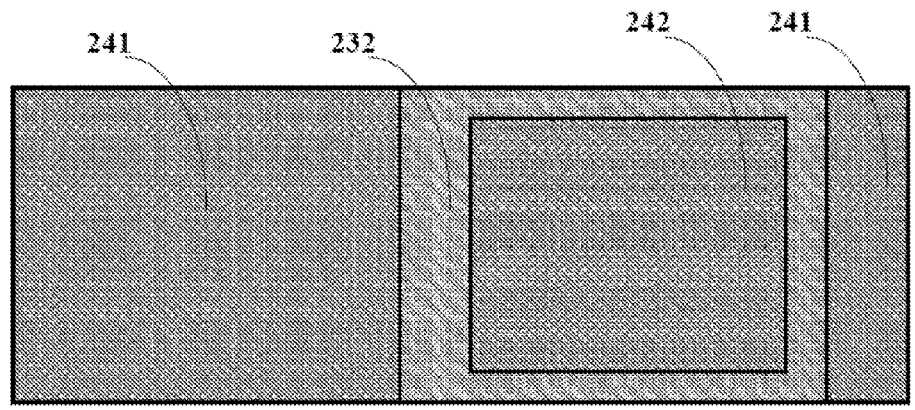

Next, provide a conductive substrate 202, the surface of which is divided into two regions, wherein the first region is an insulating region, the surface of which is the insulating material 232 and the second region is a conductive region. This patterned conductive substrate can be obtained through the following processes. Deposit an insulating material on the conductive substrate 202 via PECVD and fabricate the insulating layer protection light resistance via yellow light technology. Remove the insulating material in the conductive region through wet etching. Form a first substrate metal bonding layer 241 on the exposed substrate through electron beam evaporation coating and deposit a second substrate metal bonding layer 242 on the insulating material 232. See FIG. 17 and FIG. 18 for the side sectional view and top view of the conductive substrate, respectively.

Figure 19:
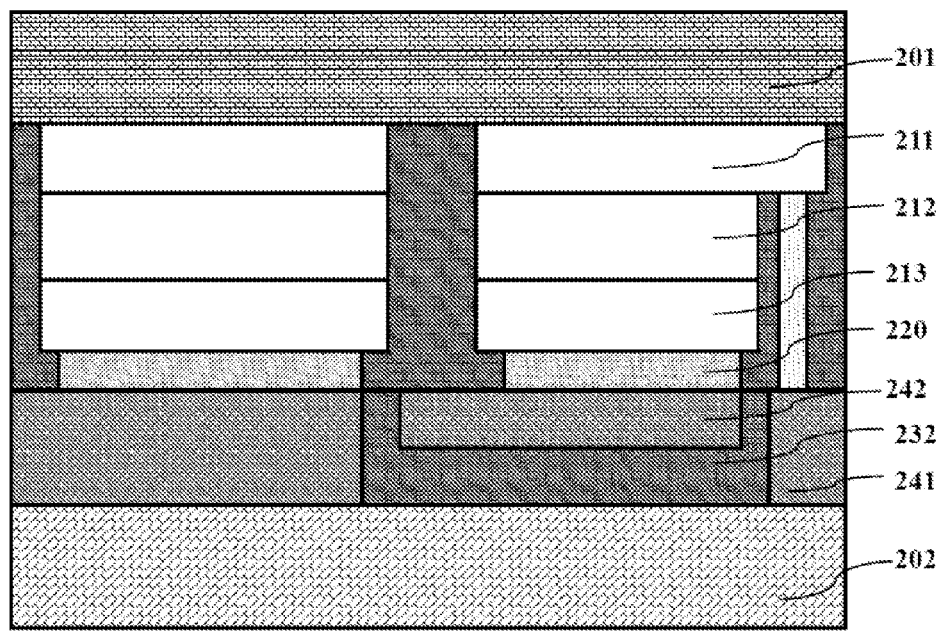

Next, bond the light-emitting epitaxial layer with the conductive substrate 202 via the wafer bonding process to form electric connection, wherein, the LED 1 is in the insulating region of the conductive substrate 202 and the p-type semiconductor layer is electrically insulated from the conductive substrate; the LED 2 is in the conductive region of the conductive substrate and an ohmic contact is formed between the p-type semiconductor layer and the conductive substrate; and the conductive column 240 is connected to the first substrate metal bonding layer 241, thereby connecting the n-type semiconductor layer of LED 1, the p-type semiconductor layer of LED 2 and the conductive substrate. See FIG. 19 for the side sectional view.

Next, remove the growth substrate 201. In this embodiment, the growth substrate is sapphire and the growth substrate can be removed by LLO.

Figure 20:
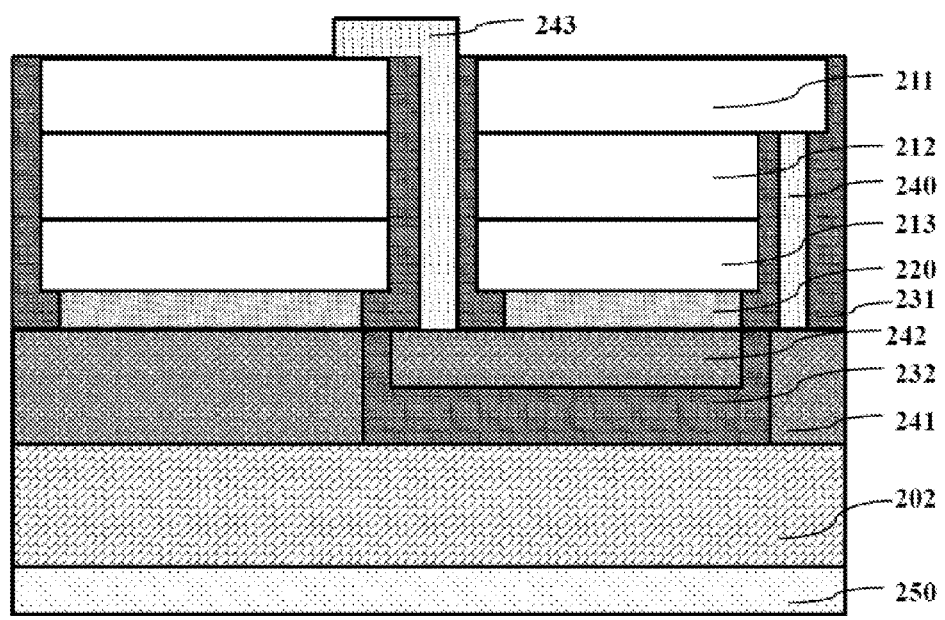

Next, form a second conductive structure according to the following processes. Fill the filling material 231 in the isolating region to the metal bonding layer 242 on the substrate insulating part via ICP dry or wet etching. Form a shared electrode layer 243 via electron beam evaporation. Thinner the conductive substrate 202 via substrate thinning technology and evaporate the back electrode 250 to form a vertical AC LED. To achieve a better light emitting effect, roughen the n-type semiconductor surface. See FIG. 20 for the side sectional view of the completed element.

Apparently, the Description of this invention shall not be interpreted as being limited to the above embodiments, which shall encompass all embodiments using the concept of this invention.

What is claimed is:

1. A vertical alternating current (AC) light-emitting diode (LED) element, comprising:
   a conductive substrate;
   a light-emitting portion disposed over the conductive substrate, the light-emitting portion including a first and a second horizontally arranged in parallel and mutually-isolated LEDs;
   wherein, the first and second LEDs include a first semiconductor layer, a light-emitting layer and a second semiconductor layer from top down; a first insulating layer is arranged between the second semiconductor layer of the first LED and the conductive substrate for mutual isolation; an ohmic contact is formed between the second semiconductor layer of the second LED and the conductive substrate;
   a conductive column configured to electrically couple the first semiconductor layer of the first LED, the second semiconductor layer of the second LED, and the conductive substrate; and
   a shared electrode layer configured to electrically couple the second semiconductor layer of the first LED and the first semiconductor layer of the second LED.

2. The vertical AC LED element of claim 1, wherein one and only one electrode structure is on the light emitting surface of the light-emitting portion that connects with the shared electrode layer.

3. The vertical AC LED element of claim 1, wherein a first channel is formed between the first LED and the second LED, wherein a side wall of the first channel is covered with a second insulating layer, wherein the first channel is filled with a conductive material to form the shared electrode layer.

4. The vertical AC LED element of claim 3, wherein two ends of the shared electrode layer are electrically coupled to the second semiconductor layer of the first LED and the first semiconductor layer of the second LED, respectively.

5. The vertical AC LED element of claim 4, wherein an ohmic contact layer is arranged between the conductive substrate and the light-emitting portion.

6. The vertical AC LED element of claim 5, wherein two ends of the shared electrode layer are connected to the first semiconductor layer of the second LED and the ohmic contact layer, respectively, to realize the electrical coupling between the second semiconductor layer of the first LED and the first semiconductor layer of the second LED.

7. The vertical AC LED element of claim 1, wherein the light-emitting portion is connected to the conductive substrate via a metal bonding layer.

8. The vertical AC LED element of claim 7, wherein the first insulating layer is between the metal bonding layer and the second semiconductor of the first LED.

9. The vertical AC LED element of claim 8, wherein a channel is arranged in the first LED that goes through the second semiconductor layer and the light-emitting layer, the bottom of which is on the first semiconductor layer, and the side wall of which is covered with an insulating layer; the metal bonding layer completely covers the second semiconductor layer of the light-emitting portion and fills the channel to form the conductive column.

10. The vertical AC LED element of claim 7, wherein the first insulating layer is on the conductive substrate and bonds with the light-emitting portion via the metal bonding layer.

* * * * *